United States Patent
Jun et al.

(10) Patent No.: US 9,437,795 B2
(45) Date of Patent: Sep. 6, 2016

(54) THERMOELECTRIC DEVICE AND METHOD OF MANUFACTURING THE SAME

(71) Applicant: Electronics and Telecommunications Research Institute, Daejeon (KR)

(72) Inventors: Dong Suk Jun, Daejeon (KR); Moon Gyu Jang, Daejeon (KR); Won Chul Choi, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/731,989

(22) Filed: Jun. 5, 2015

(65) Prior Publication Data

US 2015/0270464 A1    Sep. 24, 2015

Related U.S. Application Data

(62) Division of application No. 14/329,348, filed on Jul. 11, 2014, now Pat. No. 9,082,895.

(30) Foreign Application Priority Data

Nov. 8, 2013  (KR) .......................... 10-2013-0135484

(51) Int. Cl.
| | |
|---|---|
| H01L 35/34 | (2006.01) |
| H01L 35/14 | (2006.01) |
| H01L 35/26 | (2006.01) |
| H01L 35/02 | (2006.01) |

(52) U.S. Cl.
CPC ............... *H01L 35/14* (2013.01); *H01L 35/02* (2013.01); *H01L 35/26* (2013.01); *H01L 35/34* (2013.01)

(58) Field of Classification Search
CPC ....... H01L 35/32; H01L 35/30; H01L 35/34; H01L 35/00
USPC .......................................... 438/54; 136/236.1
See application file for complete search history.

(56) References Cited

U.S. PATENT DOCUMENTS

| | | |
|---|---|---|
| 7,309,830 B2 | 12/2007 | Zhang et al. |
| 8,508,370 B1 | 8/2013 | El-Kady et al. |
| 2010/0126548 A1 | 5/2010 | Jang et al. |
| 2013/0146114 A1 | 6/2013 | Jang |

FOREIGN PATENT DOCUMENTS

| | | |
|---|---|---|
| KR | 10-2010-0059364 A | 6/2010 |
| KR | 10-2013-0065942 A | 6/2013 |

OTHER PUBLICATIONS

Terry M.Tritt, et al., "Thermoelectric Materials, Phenomena, and Applications: A Bird's Eye View", MRS Bulletin, vol. 31, pp. 188-229, Mar. 2006.

Allon I. Hochbaum et al., "Enhanced thermoelectric performance of rough silicon nanowires", Nature, vol. 451, pp. 163-168, Jan. 10, 2008.

*Primary Examiner* — David Vu
(74) *Attorney, Agent, or Firm* — Rabin & Berdo, P.C.

(57) ABSTRACT

Provided are a thermoelectric device and a method of manufacturing the same. The method may include forming nanowires on a substrate, forming a barrier layer on the nanowires, forming a bulk layer on the barrier layer, forming a lower electrode under the substrate, and forming an upper electrode on the bulk layer.

6 Claims, 21 Drawing Sheets

THERMOELECTRIC DEVICE AND METHOD OF MANUFACTURING THE SAME

CROSS-REFERENCE TO RELATED APPLICATIONS

This is a divisional application of U.S. application Ser. No. 14/329,348, filed Jul. 11, 2014 and allowed on Mar. 17, 2015, which application claimed priority under 35 U.S.C. §119 of Korean Patent Application No. 10-2013-0135484, filed on Nov. 8, 2013. The disclosures of these U.S. and Korean applications are incorporated herein by reference.

BACKGROUND

The present invention disclosed herein relates to electric devices and methods of manufacturing the same, and more particularly, to thermoelectric devices and methods of manufacturing the same.

Recently, research into thermoelectric devices has been actively conducted as interests in clean energy have grown. A thermoelectric device may convert thermal energy into electric energy, or conversely, may generate a temperature difference by applying electric energy thereto.

A ZT value (thermoelectric figure of merit value) is used as an index that determines thermoelectric efficiency of the thermoelectric device. The ZT value is proportional to the square of the Seebeck coefficient and electric conductivity, and is inversely proportional to thermal conductivity. The ZT value may be defined as a unique property for each corresponding material. For example, with respect to metal, a value of the Seebeck coefficient is very low at a few $\mu V/K$. The electric conductivity and the thermal conductivity are in a proportional relationship by the Wiedemann-Franz law. This means that, with respect to metal, heat transfer mostly occurs by free charges such as electrons or holes. Therefore, with respect to metal, the realization of low thermal conductivity that is essentially required for the thermoelectric device may be very difficult. Also, the improvement of the ZT value using metal may be virtually impossible.

However, with respect to a semiconductor, since its charge concentration may be freely adjusted, heat transfer by free charges may be appropriately controlled. A major mediator of the heat transfer in the semiconductor is a lattice, and a phonon is lattice vibration which is quantized and described as waves. Therefore, if the concentration of the free charges in the semiconductor is appropriately adjusted to minimize the heat transfer by the free charges and inhibit the propagation of phonons, thermal conductivity may be rapidly decreased.

As commercialized materials for a thermoelectric device, $Bi_2Te_3$ is used at room temperature and SiGe is used at a high temperature. A ZT value of $Bi_2Te_3$ is 0.7 at room temperature and is a maximum of 0.9 at 120° C. A ZT value of SiGe is about 0.1 at room temperature and is a maximum of 0.9 at 900° C.

Research into thermoelectric devices based on silicon, a basic material of the semiconductor industry, has attracted attention. Since silcon has a ZT value of 0.01 due to its very high thermal conductivity of 150 W/m·K, it has been recognized that utilization of silicon as a thermoelectric device may be difficult. However, with respect to silicon nanowires grown by chemical vapor deposition (CVD), it has recently been reported that thermal conductivity may be decreased to 0.01 times or less, and accordingly, a ZT value is close to 1.

SUMMARY

The present invention provides a thermoelectric device which may increase electric conductivity and decrease thermal conductivity, and a method of manufacturing the same.

The present invention also provides a thermoelectric device which may prevent the collapse of nanowires, and a method of manufacturing the same.

Embodiments of the inventive concept provide methods of manufacturing a thermoelectric device including: forming nanowires on a substrate; forming a barrier layer on the nanowires; forming a bulk layer on the barrier layer; and forming a lower electrode under the substrate and forming an upper electrode on the bulk layer.

In some embodiments, the nanowires may be formed by a nanowire growth method using seeds. The nanowire growth method may include a metal organic vapor phase epitaxy method.

In other embodiments, the forming of the nanowires may include: forming trenches on the substrate; forming the seeds in the trenches; and forming the nanowires on the seeds from inside of the trenches to above the substrate.

In still other embodiments, the forming of the nanowires may further include collecting the seeds on bottoms of the trenches by heat treating the seeds in the trenches.

In even other embodiments, the forming of the seeds may include: depositing a seed metal in the trenches and on the substrate; and forming the seeds in the trenches by patterning the seed metal.

In yet other embodiments, the forming of the seeds may further include: depositing a seed metal in the trenches and on the substrate; and chemical mechanical polishing the seed metal.

In further embodiments, the nanowires are formed to have the same width or thickness as a size of the trenches.

In still further embodiments, the method may further include removing the seeds after the forming of the nanowires.

In even further embodiments, the seeds may be removed by a wet etching method.

In yet further embodiments, the method may further include forming a polymer layer between the nanowires.

In other embodiments of the inventive concept, methods of manufacturing a thermoelectric device include: respectively forming first and second nanowires on first and second substrates; respectively forming first and second barrier layers on the first and second nanowires; respectively forming first and second bulk layers on the first and second barrier layers; respectively forming first and second lower electrodes under the first and second substrates, and respectively forming first and second upper electrodes on the first and second bulk layers; and respectively forming first and second cooling pads under the first and second lower electrodes, and forming a heater pad on the first and second upper electrodes.

In some embodiments, the first substrate, the first nanowires, and the first bulk layer may be doped with a first conductive impurity, and the second substrate, the second nanowires, and the second bulk layer are doped with a second conductive impurity having conductivity different from that of the first conductive impurity.

In other embodiments, the first and second upper electrodes may be commonly connected by the heater pad.

In still other embodiments of the inventive concept, thermoelectric devices include: first and second cooling pads; first and second lower electrodes that are respectively disposed on the first and second cooling pads; first and second substrates that are respectively disposed on the first and second lower electrodes; first and second nanowires that are respectively disposed on the first and second substrates; first and second barrier layers that are respectively disposed on the first and second nanowires; first and second bulk layers that are respectively disposed on the first and second barrier layers; first and second upper electrodes respectively on the first and second bulk layers; and a heater pad that is disposed on the first and second upper electrodes and connects the first and second upper electrodes, wherein the first and second barrier layers may increase electric conductivity between the first and second nanowires and the first and second bulk layers, and may decrease thermal conductivity therebetween.

In some embodiments, the first and second substrates may respectively include first and second trenches in which the first and second nanowires are inserted.

In other embodiments, the thermoelectric device may further include first and second polymer layers that are respectively formed between the first and second nanowires.

In still other embodiments, the first and second polymer layers may respectively include polyimide.

In even other embodiments, the first and second barrier layers may respectively include a rare metal or a rare earth metal.

In yet other embodiments, the first and second substrates may respectively include crystalline silicon that is doped with a conductive impurity.

In further embodiments, the first and second bulk layers may respectively include silicon that is doped with the same conductive impurity as the first and second substrates.

BRIEF DESCRIPTION OF THE DRAWINGS

The accompanying drawings are included to provide a further understanding of the present invention, and are incorporated in and constitute a part of this specification. The drawings illustrate exemplary embodiments of the inventive concept and, together with the description, serve to explain principles of the present invention. In the drawings.

DETAILED DESCRIPTION OF THE EMBODIMENTS

Figure 1:
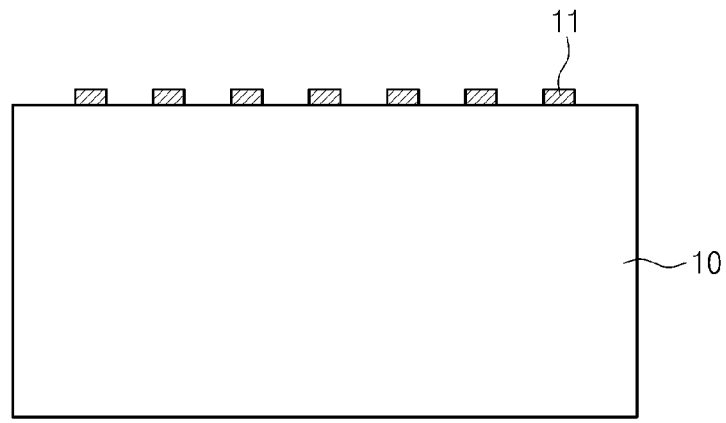
FIGS. 1 to 15 are cross-sectional views illustrating a thermoelectric device according to a first embodiment of the inventive concept.

Hereinafter, preferred embodiments of the inventive concept will be described in more detail with reference to the accompanying drawings. Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals denote like elements throughout the specification.

In the following description, the technical terms are used only for explaining specific embodiments while not limiting the present invention. The terms of a singular form may include plural forms unless referred to the contrary. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Since preferred embodiments are provided below, the order of the reference numerals given in the description is not limited thereto.

First Embodiment

FIGS. 1 to 15 are cross-sectional views illustrating a thermoelectric device according to a first embodiment of the inventive concept.

Figure 2:
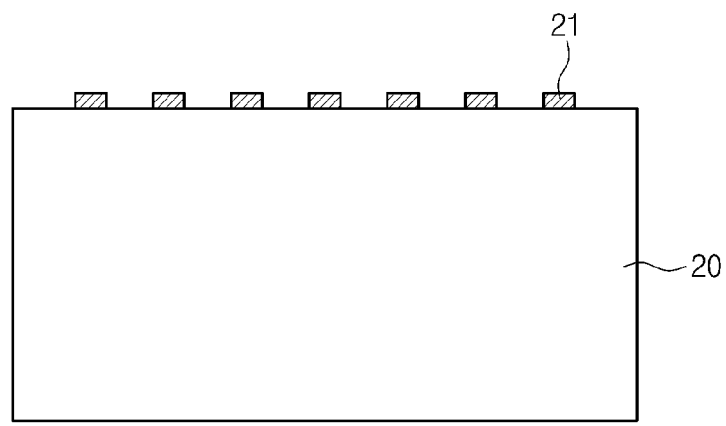

Referring to FIGS. 1 and 2, first and second seeds 11 and 21 are respectively formed on first and second substrates 10 and 20. The first and second substrates 10 and 20 may include crystalline silicon. The first and second substrates 10 and 20 may be respectively doped with first and second conductive impurities. For example, the first conductive impurity may include a P-type dopant such as boron, gallium, or indium. The second conductive impurity may include an N-type dopant such as arsenic, phosphorous, nitride, or antimony. The first substrate 10 may include a P-type silicon substrate and the second substrate 20 may include an N-type silicon substrate. The first and second seeds 11 and 21 may respectively include gold (Au).

Figure 3:
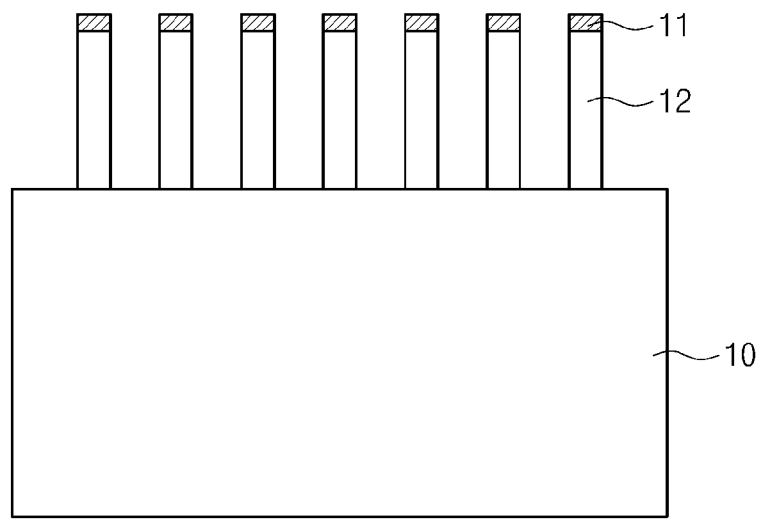
Figure 4:
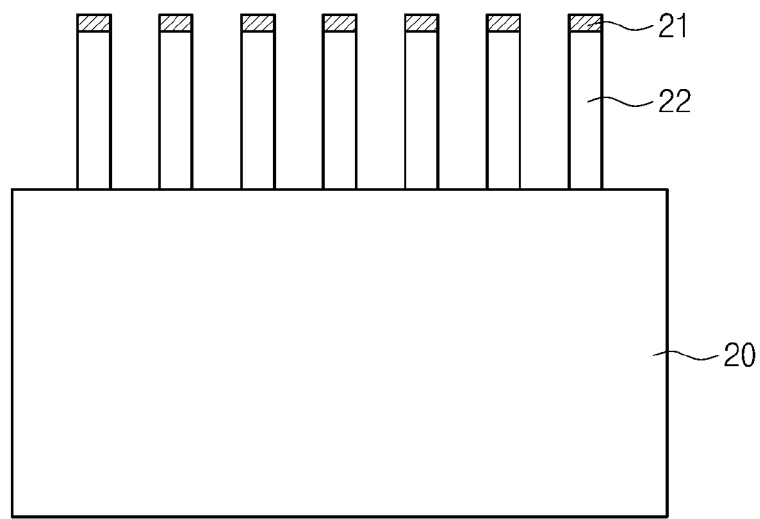

Referring to FIGS. 3 and 4, first and second nanowires 12 and 22 are respectively formed on the first and second substrates 10 and 20. The forming of the first and second nanowires 12 and 22 may include a nanowire growth method using the first and second seeds 11 and 21. The nanowire growth method may include a metal organic chemical vapor deposition (MOCVD) method. The first and second nanowires 12 and 22 may be vertically formed on the first and second substrates 10 and 20 under the first and second seeds 11 and 21. The first and second nanowires 12 and 22 may include silicon nanowires. The first and second nanowires 12 and 22 may be respectively doped with the first and second conductive impurities. The first nanowires 12 may respectively include P-type silicon nanowires. The second nanowires 22 may respectively include N-type silicon nanowires.

Figure 5:
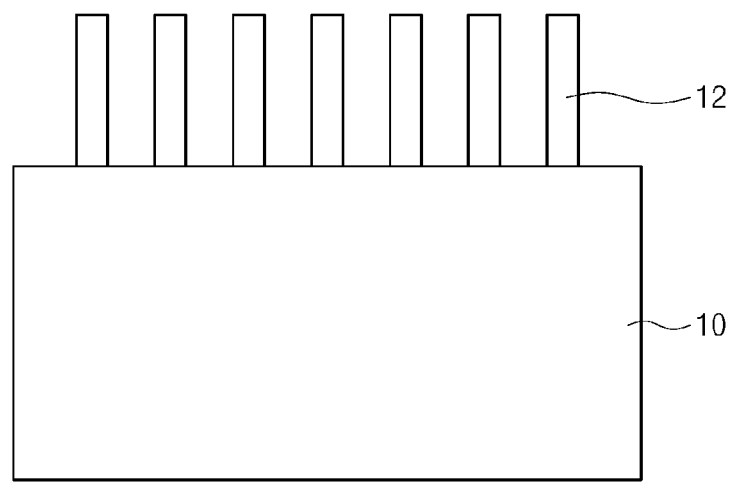
Figure 6:
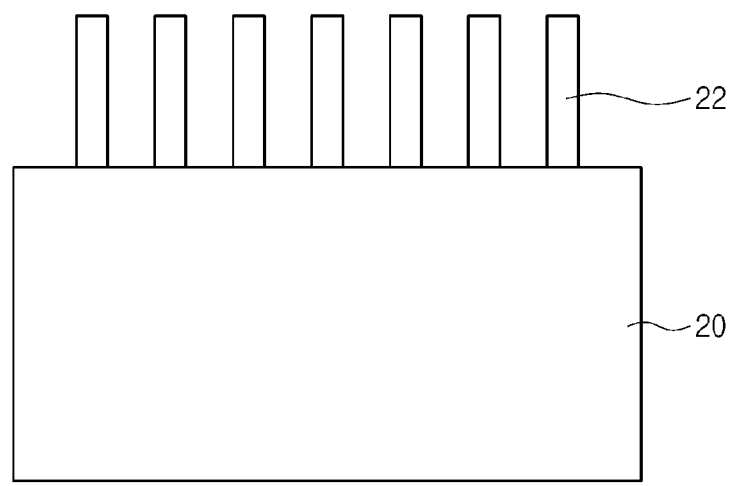

Referring to FIGS. 5 and 6, the first and second seeds 11 and 21 on the first and second nanowires 12 and 22 are removed. The removing of the first and second seeds 11 and 21 may include a wet etching method. An etching solution used in the wet etching method may have an etch selectivity with respect to the first and second nanowires 12 and 22 and the first and second seeds 11 and 21. For example, the etching solution may include an acid solution such as sulfuric acid, nitric acid, phosphoric acid, or hydrochloric acid.

Figure 7:
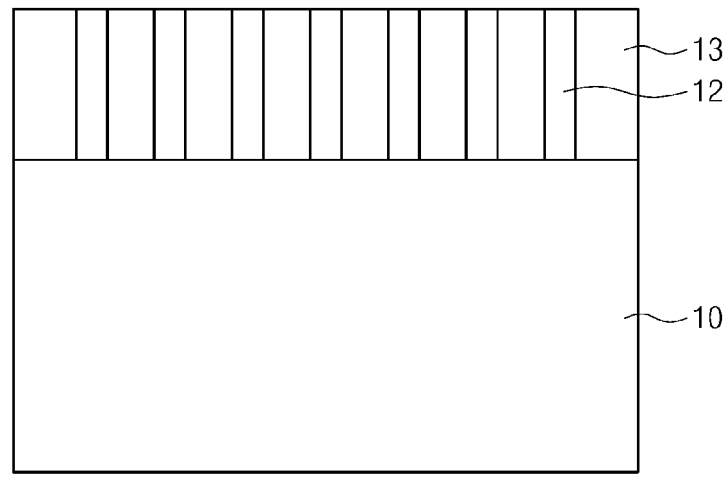
Figure 8:
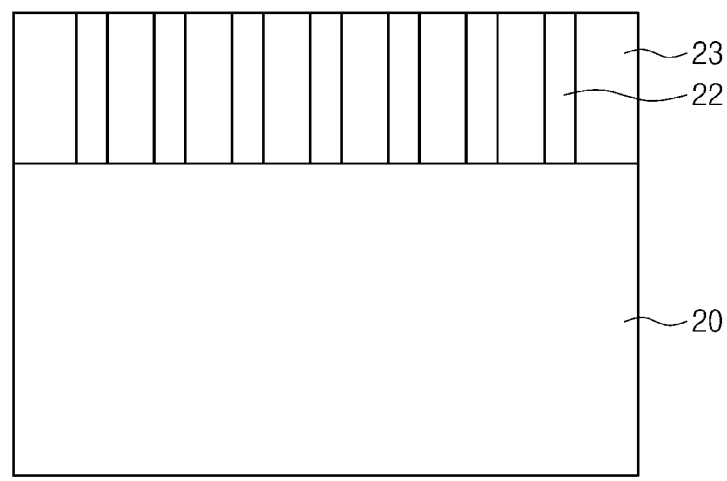

Referring to FIGS. 7 and 8, first and second polymer layers 13 and 23 are respectively filled between the first and second nanowires 12 and 22. The first and second polymer layers 13 and 23 may fix the first and second nanowires 12 and 22. For example, the first and second polymer layers 13 and 23 may respectively include polyimide.

Figure 9:
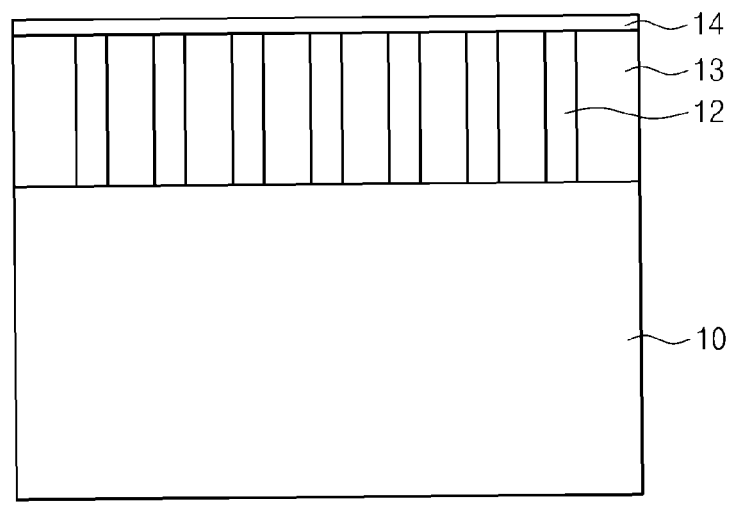
Figure 10:
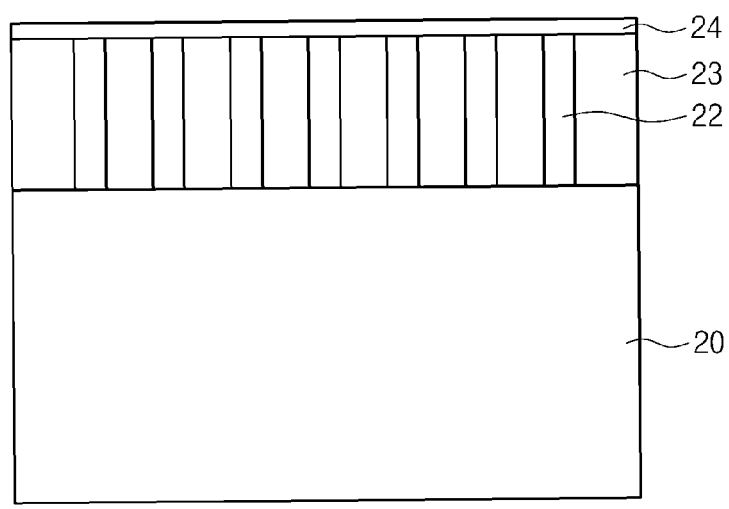

Referring to FIGS. 9 and 10, first and second barrier layers 14 and 24 are respectively formed on the first and second nanowires 12 and 22 and the first and second polymer layers 13 and 23. For example, the first barrier layer 14 may include a rare metal such as magnesium (Mg), platinum (Pt), ytterbium (Yb), nickel (Ni), cobalt (Co), or titanium (Ti). The second barrier layer 24 may include a rare earth metal such as erbium (Er), europium (Eu), or samarium (Sm). The rare metal and the rare earth metal may have almost the highest Seebeck coefficient among materials existing in nature. The forming of the first and second barrier layers 14 and 24 may include a deposition process of the rare metal or the rare earth metal and a heat treatment process. For example, the deposition process may include a sputtering process. The rare metal or the rare earth metal may be formed to a thickness of about 30 nm or less. The heat treatment process is a process of heating the rare metal or the rare earth metal to about 600° C. or more. The first barrier layer 14 may include platinum and the second barrier layer 24 may include erbium. Herein, the platinum may maximize the Seebeck coefficient of the thermoelectric device. Also, the first and second barrier layers 14 and 24 may have the same thickness as the first and second substrates 10 and 20. Therefore, the first and second barrier layers 14 and 24 may suppress the thermal conductivity of the thermoelectric device.

Also, the first and second nanowires 12 and 22 and the first and second barrier layers 14 and 24 may have ohmic contacts. Resistance between the first and second barrier layers 14 and 24 and the first and second nanowires 12 and 22 may be constant.

Figure 11:
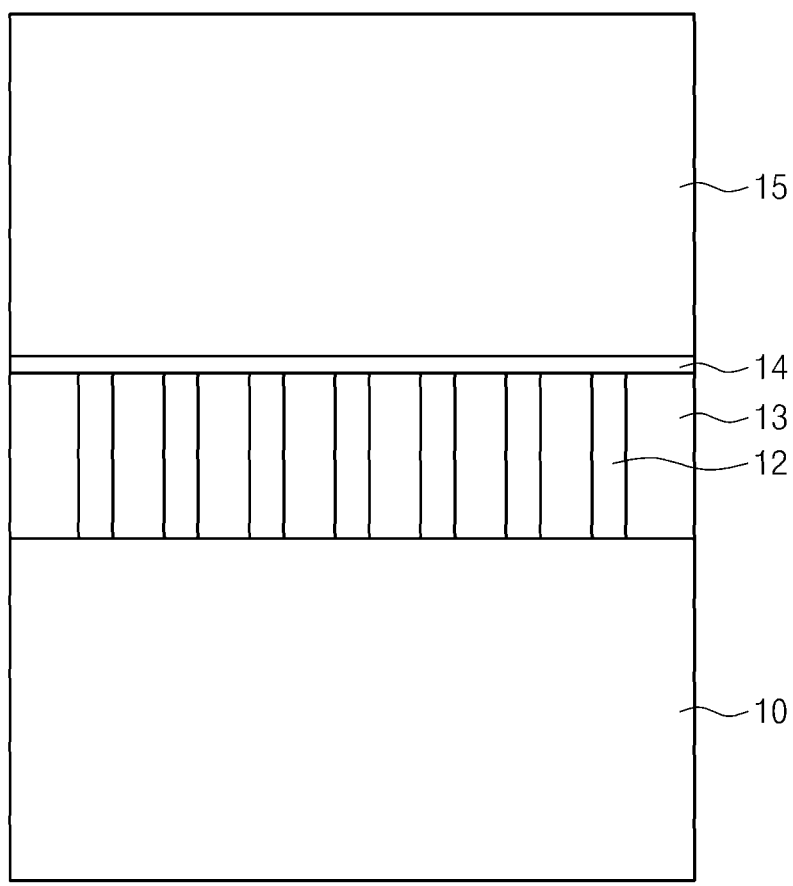
Figure 12:
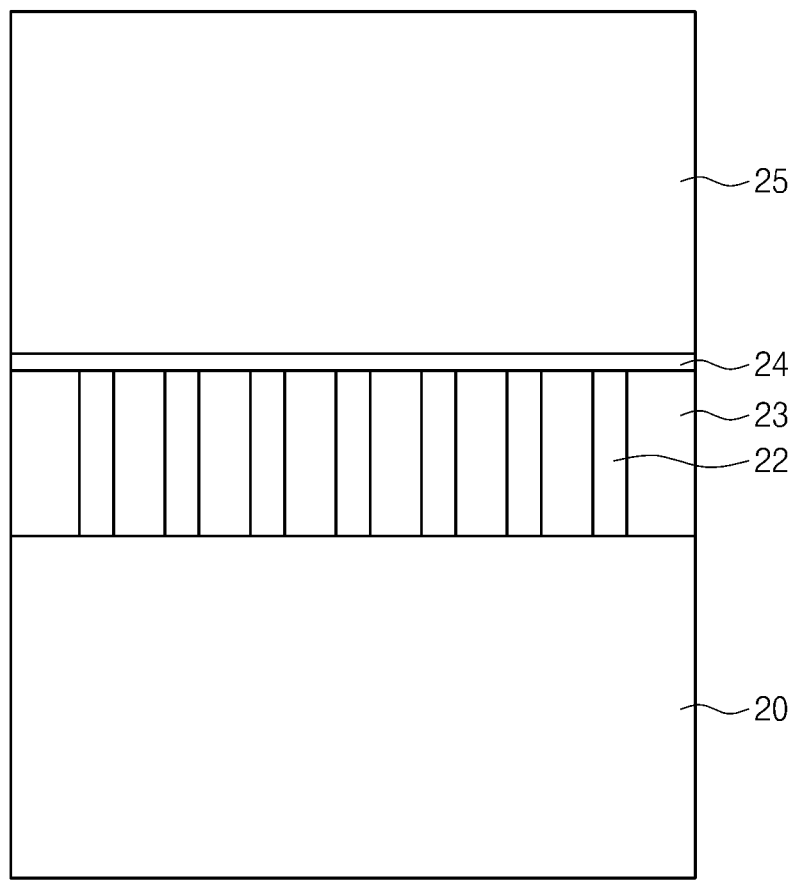

Referring to FIGS. 11 and 12, first and second bulk layers 15 and 25 are respectively formed on the first and second barrier layers 14 and 24. The first and second bulk layers 15 and 25 may be first and second upper substrates of crystalline silicon. Also, the first and second bulk layers 15 and 25 may include polysilicon formed by a chemical vapor deposition method. The first and second bulk layers 15 and 25 may be respectively doped with the first and second conductive impurities. The first bulk layer 15 may have the same conductive type as the first substrate 10 and the first nanowires 13. Similarly, the second bulk layer 25 may have the same conductive type as the second substrate 20 and the second nanowires 23.

The first and second barrier layers 14 and 24 and the first and second bulk layers 15 and 25 may have ohmic contacts. A current may be increased in proportional to a power voltage applied between the first and second barrier layers 14 and 24 and the first and second bulk layers 15 and 25. Resistance between the first and second barrier layers 14 and 24 and the first and second bulk layers 15 and 25 may be constant. Therefore, the first and second barrier layers 14 and 24 may increase electric conductivity between the first and second nanowires 12 and 22 and the first and second bulk layers 15 and 25.

Figure 13:
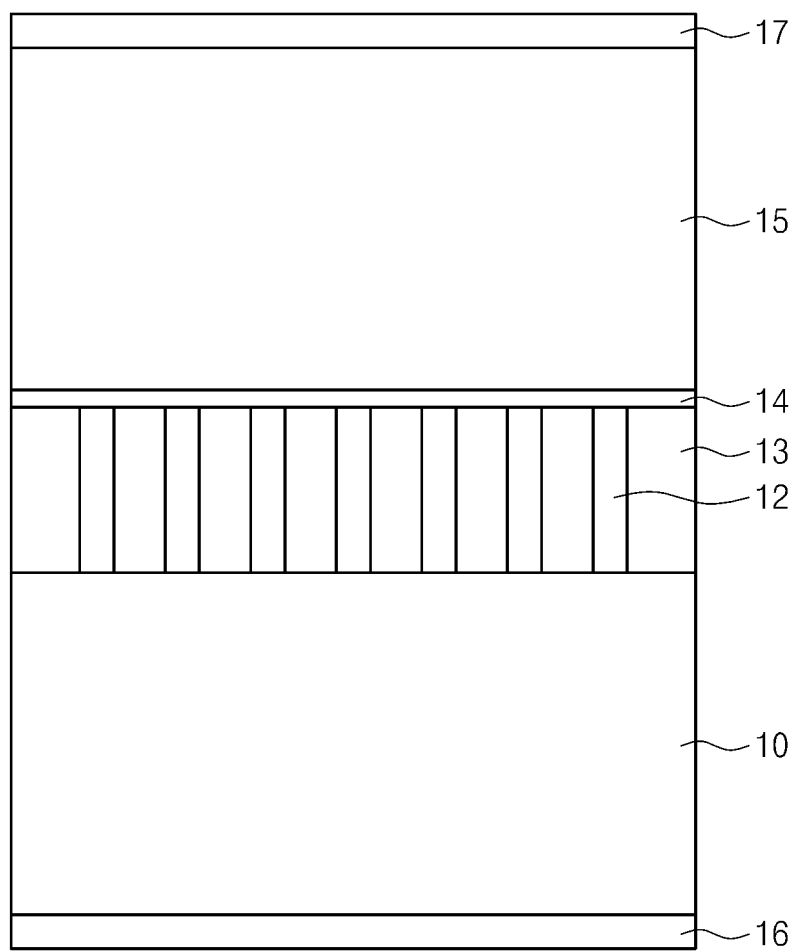
Figure 14:
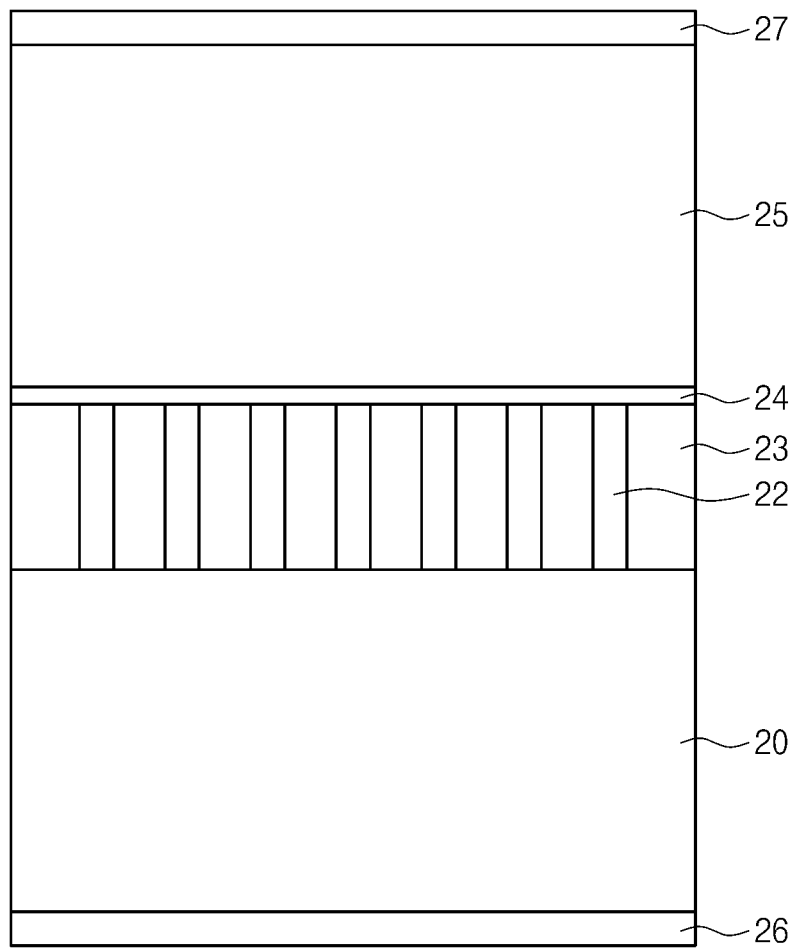

Referring to FIGS. 13 and 14, first and second lower electrodes 16 and 26 are respectively formed under the first and second substrates 10 and 20, and first and second upper electrodes 17 and 27 are respectively formed on the first and second bulk layers 15 and 25. The first and second lower electrodes 16 and 26 and the first and second upper electrodes 17 and 27 may be formed by a metal deposition process, a photolithography process, and an etching process. The first and second lower electrodes 16 and 26 and the first and second upper electrodes 17 and 27 may include at least one metal of aluminum (Al), copper (Cu), tungsten (W), Ti, silver (Ag), Au, Pt, Ni, carbon (C), molybdenum (Mo), tantalum (Ta), iridium (Ir), ruthenium (Ru), zinc (Zn), tin (Sn), and indium (In).

Although not illustrated in FIGS. 13 and 14, the first and second substrates 10 and 20 may be sawn and then be separated into separate devices. A size of the sawn first and second substrates 10 and 20 may be 1.5×1.5 $mm^2$ or less.

Figure 15:
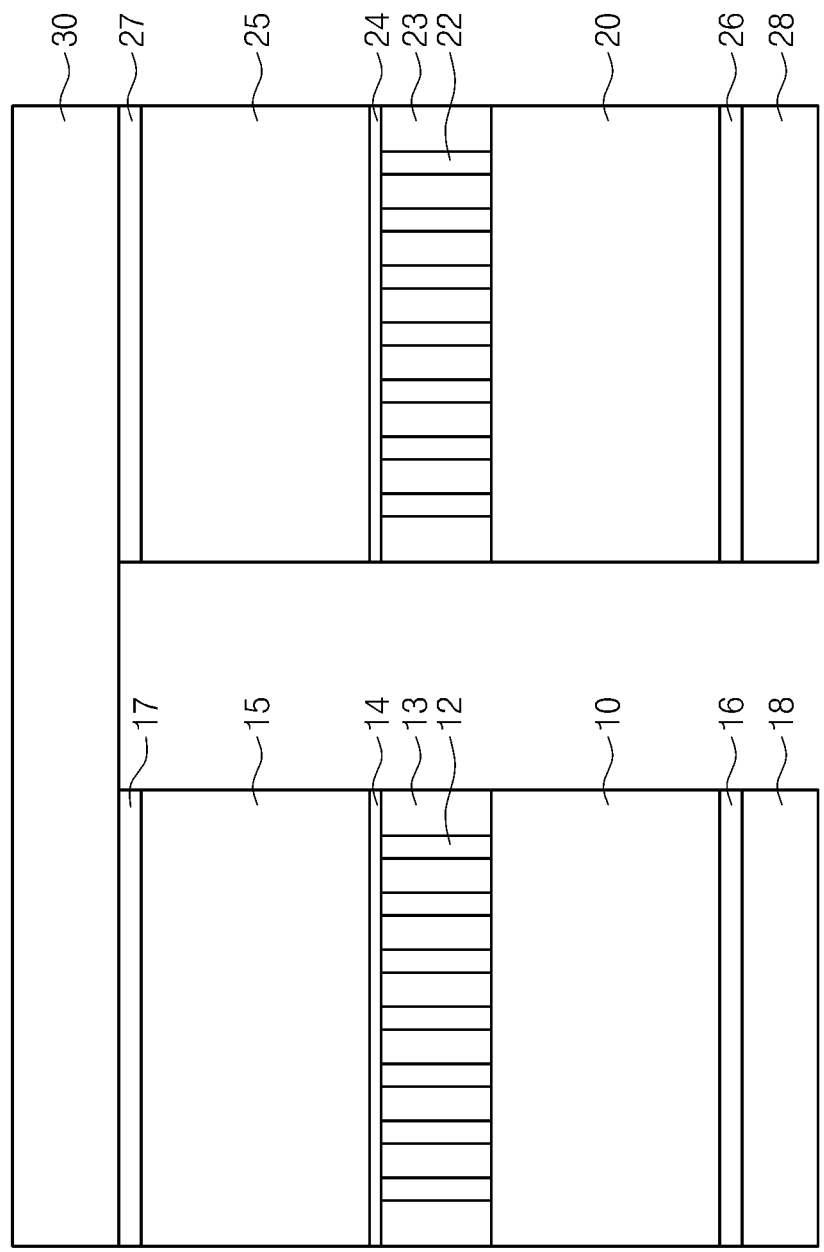

Referring to FIG. 15, first and second cooling pads 18 and 28 are respectively formed under the first and second lower electrodes 16 and 26, and a heater pad 30 is formed on the first and second upper electrodes 17 and 27. The first and second cooling pads 18 and 28 may be bonded to the first and second lower electrodes 16 and 26 with a metal having excellent conductivity. The first and second cooling pads 18 and 28 may be cooling parts which are to be disposed at a temperature lower than that of the heater pad 30. The heater pad 30 may be bonded to the first and second upper electrodes 17 and 27 with a metal having excellent conductivity. The heater pad 30 may be a heater part which is to be disposed at a temperature higher than that of the first and second cooling pads 18 and 28.

Although not illustrated in FIG. 15, a silicon-based three-dimensional thermoelectric device array of the present invention may include a metal pad for connecting to a module. For the preparation of a packageable electrode of the three-dimensional thermoelectric device, a bondable material may be finally deposited for preparing the module and may have a sufficiently large thickness. The pad of the silicon-based three-dimensional thermoelectric device array of the present invention may have a metal facilitating wire bonding and may have a sufficiently large thickness. A spacing between the pads of the three-dimensional thermoelectric device array may be sufficiently large so as to facilitate wire bonding. Also, position, shape, and material of an input electrode of the three-dimensional thermoelectric module prepared using a three-dimensional thermoelectric device may be designed to be able to wire bond to the thermoelectric device.

Second Embodiment

FIGS. 16 to 32 are cross-sectional views illustrating a method of manufacturing a thermoelectric device according to a second embodiment of the inventive concept.

Figure 16:
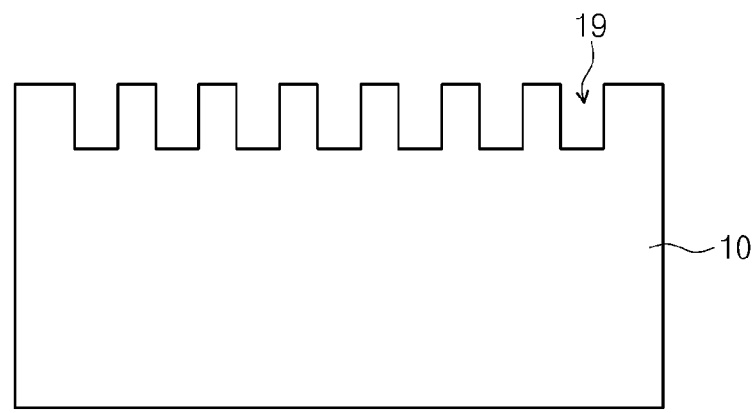
FIGS. 16 to 32 are cross-sectional views illustrating a method of manufacturing a thermoelectric device according to a second embodiment of the inventive concept.
Figure 17:
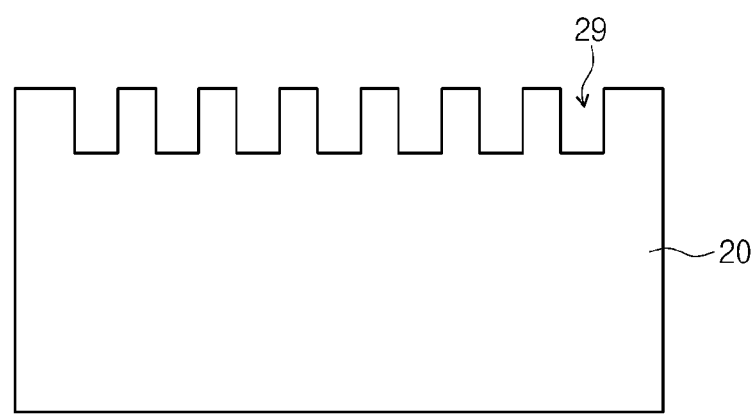

Referring to FIGS. 16 and 17, first and second trenches 19 and 29 are respectively formed on first and second substrates 10 and 20. The first and second trenches 19 and 29 may be formed by a photolithography process and an etching process.

Figure 18:
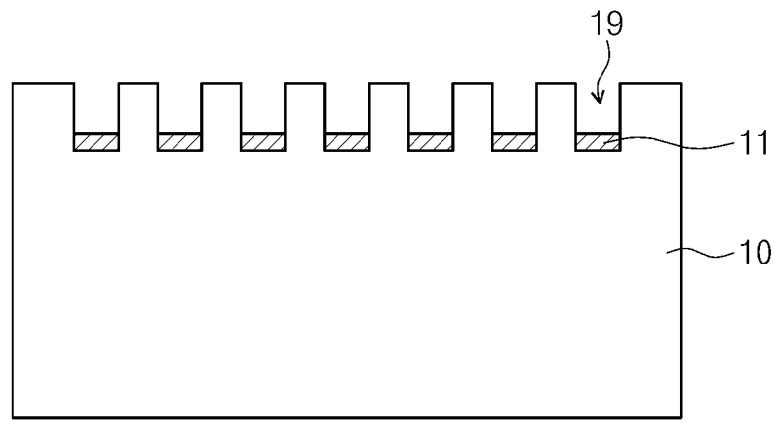
Figure 19:
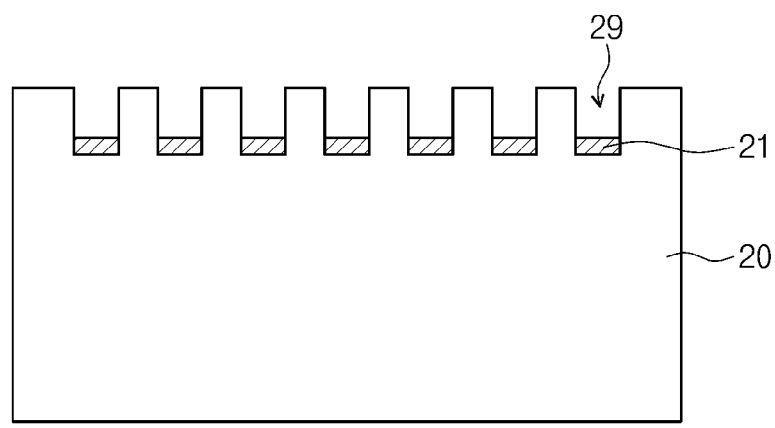

Referring to FIGS. 18 and 19, first and second seeds 11 and 21 are respectively formed in the first and second trenches 19 and 29. The first and second seeds 11 and 21 may respectively include Au. According to an embodiment of the inventive concept, the first and second seeds 11 and 21 may respectively have a thickness smaller than a depth of the first and second trenches 19 and 29. The first and second seeds 11 and 21 may be formed by a metal deposition process, a photolithography process, and an etching process. Also, the first and second seeds 11 and 21 may be formed by a printing process or a dispensing method. Thereafter, the first and second seeds 11 and 21 may be concentrated on bottoms of the first and second trenches 19 and 29 by a heat treatment process.

According to another embodiment of the inventive concept, the first and second seeds 11 and 21 may respective have the same thickness as the depth of the first and second trenches 19 and 29. The forming of the first and second seeds 11 and 21 may include a metal deposition process for forming a seed metal (not shown) in the first and second trenches 19 and 29 and on the first and second substrates 10 and 20, and a chemical mechanical polishing (CMP) process for polishing the seed metal flat.

Figure 20:
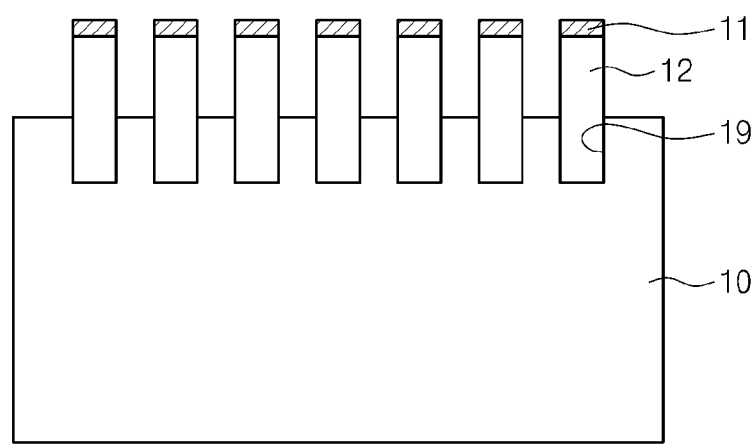
Figure 21:
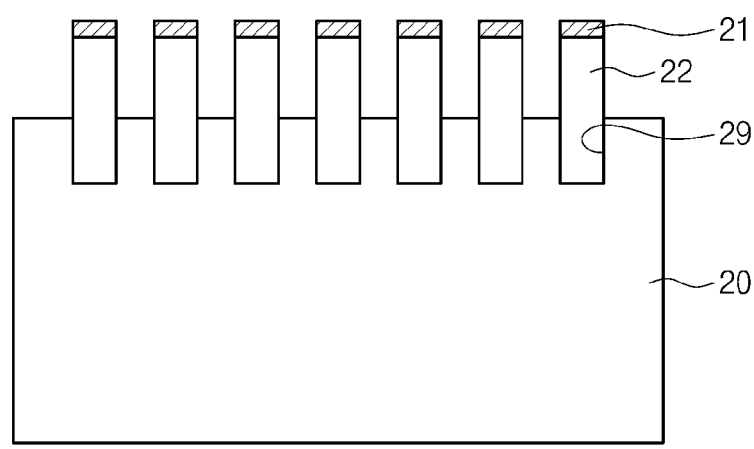

Referring to FIGS. 20 and 21, first and second nanowires 12 and 22 are respectively formed from the bottoms of the first and second trenches 19 and 29 to above the first and second substrates 10 and 20. The first and second nanowires 12 and 22 may be vertically formed from the bottoms of the first and second trenches 19 and 29 under the first and second seeds 11 and 21. The first and second nanowires 12 and 22 may protrude above the first and second substrates 10 and 20. The first and second trenches 19 and 29 may prevent the collapse of the first and second nanowires 12 and 22 when the first and second nanowires 12 and 22 grow above the first and second substrates 10 and 20. The first and second trenches 19 and 29 may define a width or thickness of the first and second nanowires 12 and 22. That is, the first and second nanowires 12 and 22 may be formed to have the same width or thickness as the size of the first and second trenches 19 and 29.

Figure 22:
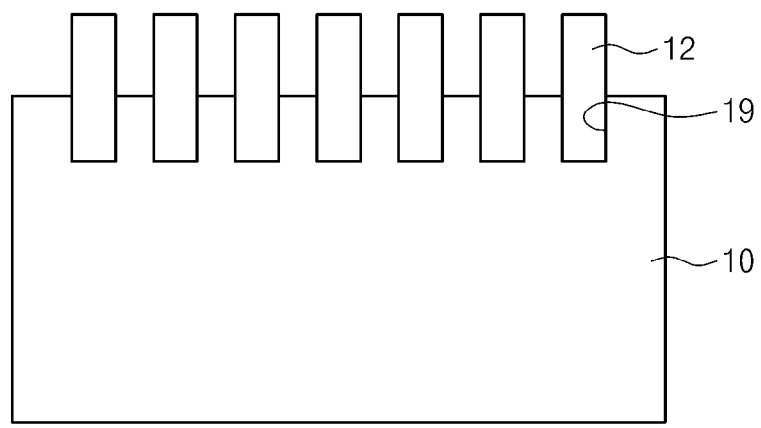
Figure 23:
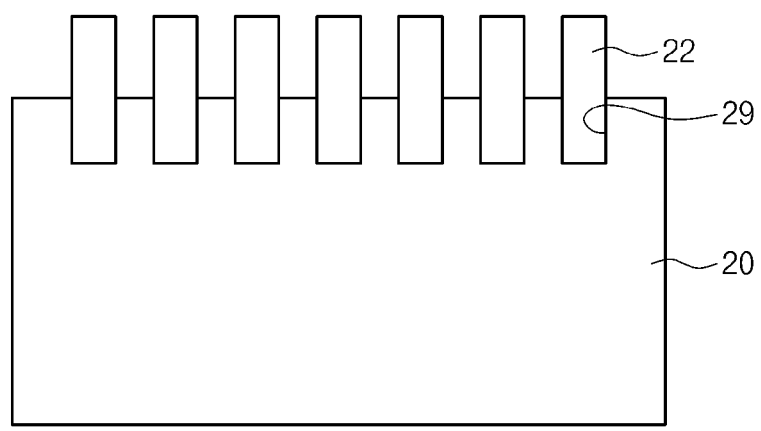

Referring to FIGS. 22 and 23, the first and second seeds 11 and 21 on the first and second nanowires 12 and 22 are removed. The removing of the first and second seeds 11 and 21 may include a wet etching method. The first and second trenches 19 and 29 may prevent the collapse of the first and second nanowires 12 and 22 due to an etching solution in the wet etching method during the removal of the first and second seeds 11 and 21. The first and second nanowires 12 and 22 may be exposed to an etching solution having a predetermined flow rate. The first and second nanowires 12 and 22 may be supported by the first and second trenches 19 and 29. Therefore, the method of manufacturing a thermoelectric device according to the second embodiment of the inventive concept may improve production yield.

Figure 24:
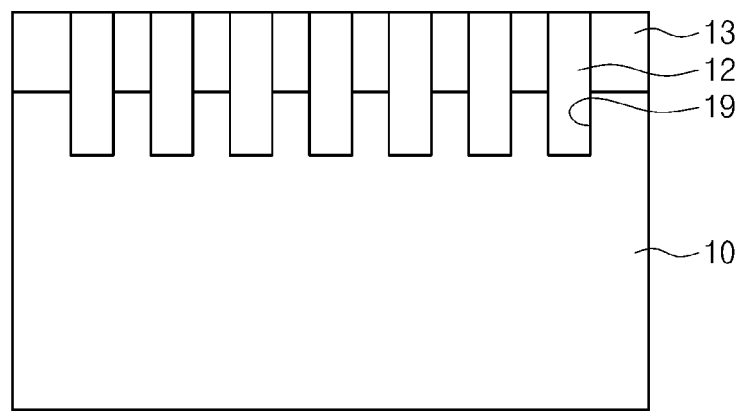
Figure 25:
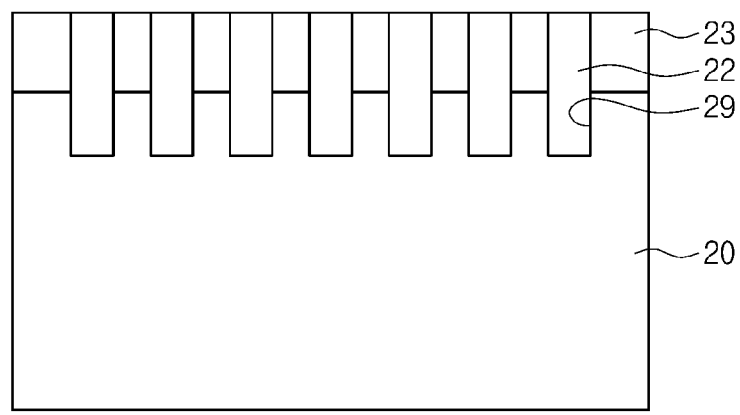

Referring to FIGS. 24 and 25, first and second polymer layers 13 and 23 are respectively formed on the first and second substrates 10 and 20 between the first and second nanowires 12 and 22. The first and second polymer layers 13 and 23 may fix the first and second nanowires 12 and 22. For example, the first and second polymer layers 13 and 23 may respectively include polyimide.

Figure 26:
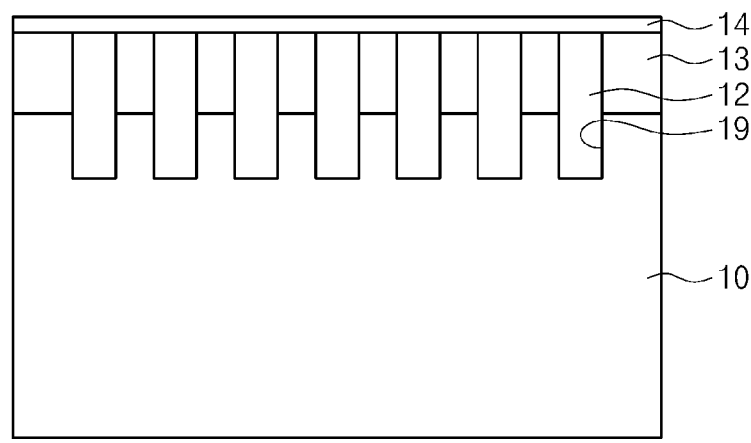
Figure 27:
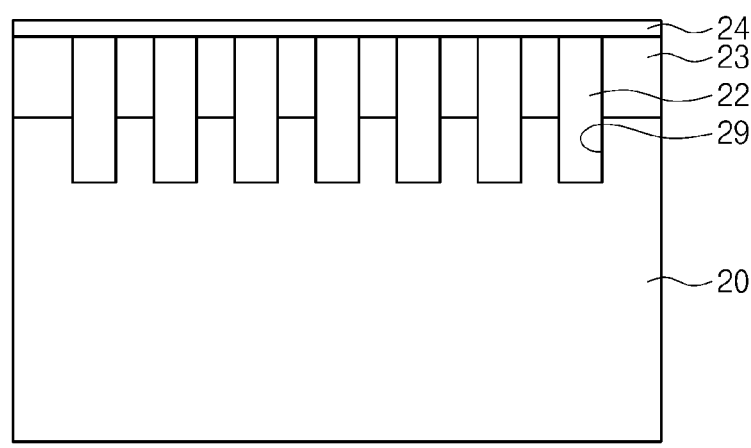

Referring to FIGS. 26 and 27, first and second barrier layers 14 and 24 are respectively formed on the first and second nanowires 12 and 22 and the first and second polymer layers 13 and 23. For example, the first barrier layer 14 may include a rare metal such as Mg, Pt, Yb, Ni, Co, or Ti. The second barrier layer 24 may include a rare earth metal such as Er, Eu, or Sm.

Figure 28:
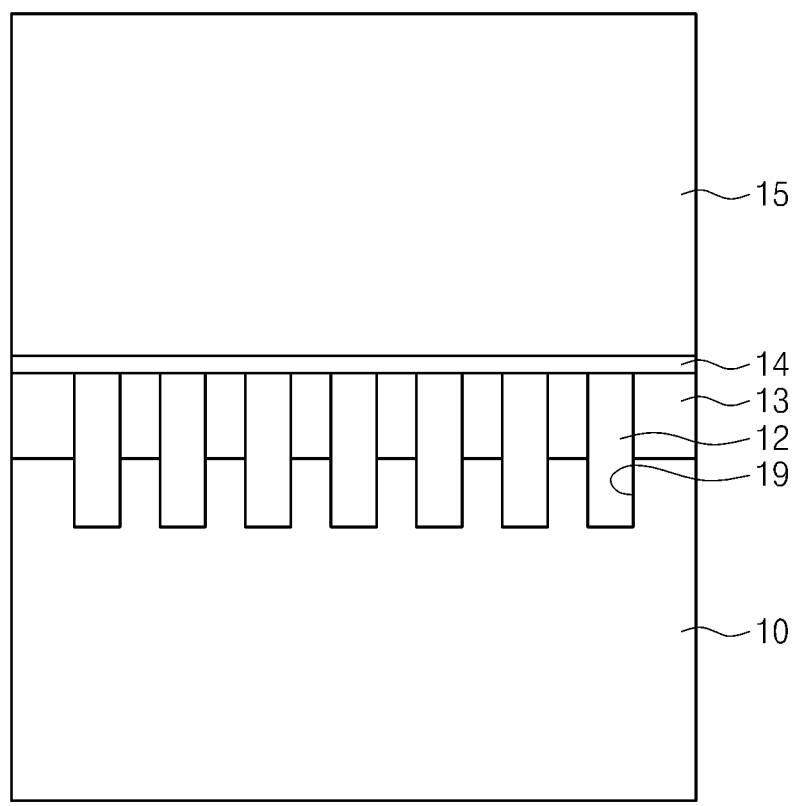
Figure 29:
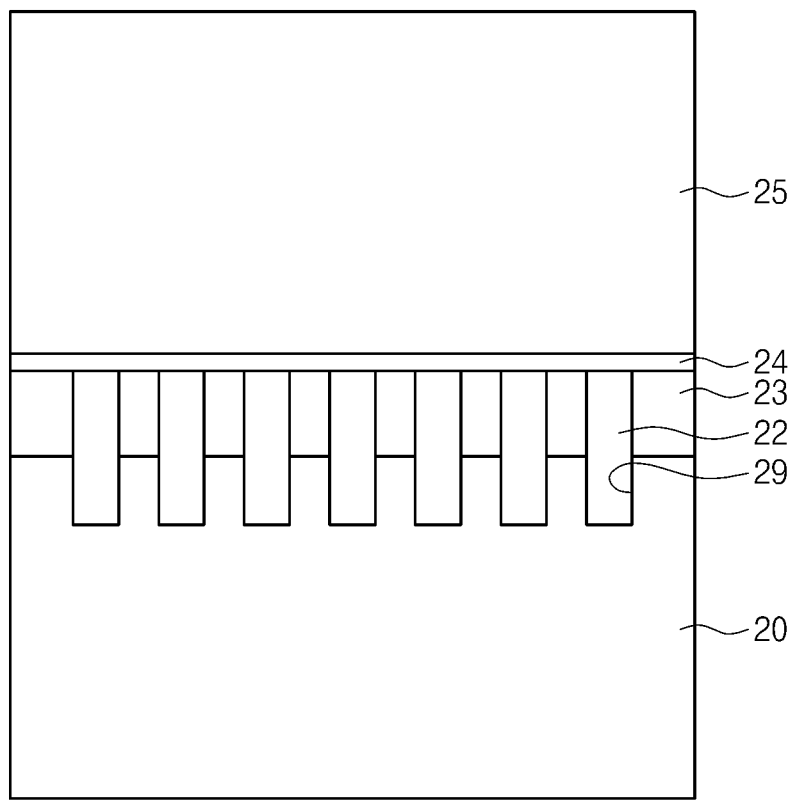

Referring to FIGS. 28 and 29, first and second bulk layers 15 and 25 are respectively formed on the first and second barrier layers 14 and 24. The first and second bulk layers 15 and 25 may be first and second upper substrates of crystalline silicon. Also, the first and second bulk layers 15 and 25 may include polysilicon formed by a chemical vapor deposition method. The first and second bulk layers 15 and 25 may be respectively doped with first and second conductive impurities. The first bulk layer 15 may have the same conductive type as the first substrate 10 and the first nanowires 13. Similarly, the second bulk layer 25 may have the same conductive type as the second substrate 20 and the second nanowires 23. The first and second barrier layers 14 and 24 may increase electric conductivity between the first and second nanowires 12 and 22 and the first and second bulk layers 15 and 25 and may suppress thermal conductivity therebetween.

Figure 30:
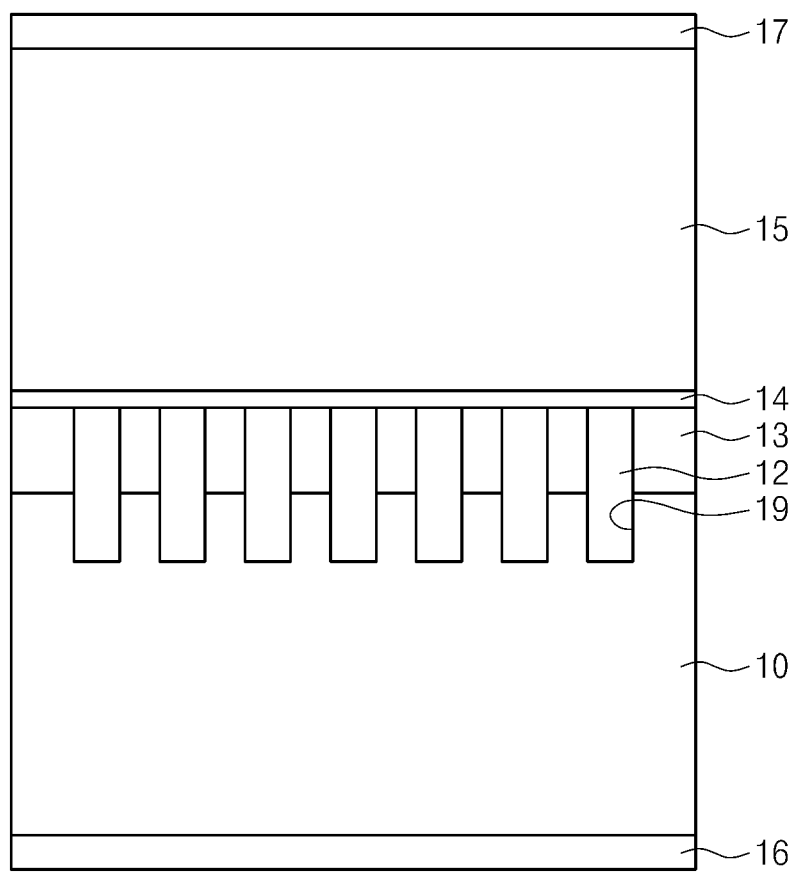
Figure 31:
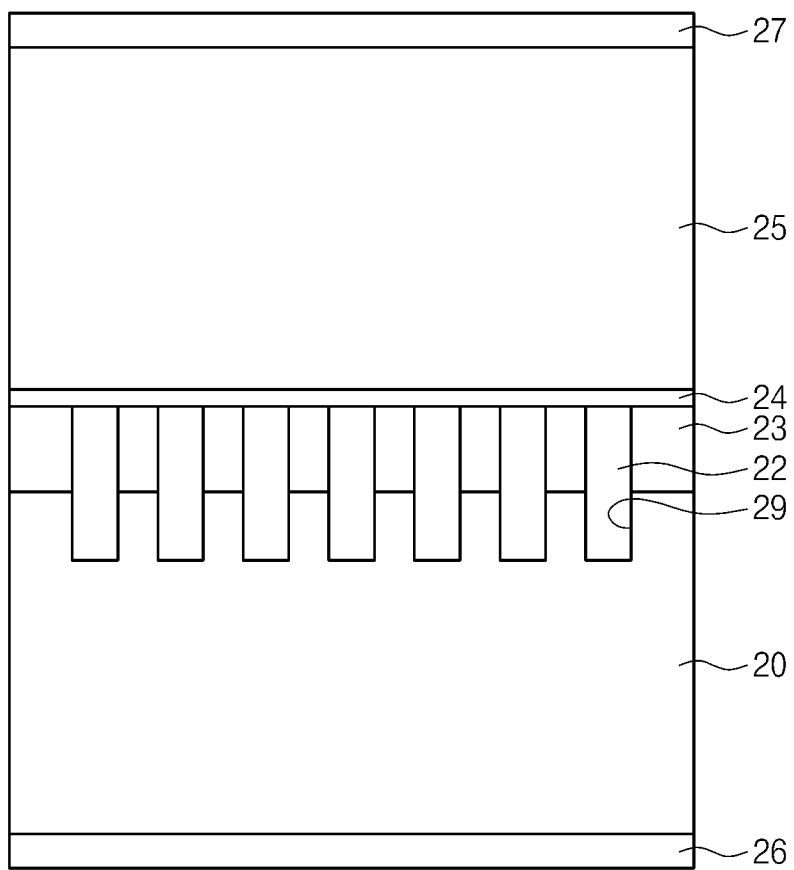

Referring to FIGS. 30 and 31, first and second lower electrodes 16 and 26 are respectively formed under the first and second substrates 10 and 20, and first and second upper electrodes 17 and 27 are respectively formed on the first and second bulk layers 15 and 25. The first and second lower electrodes 16 and 26 and the first and second upper electrodes 17 and 27 may be formed by a deposition method.

The first and second lower electrodes 16 and 26 and the first and second upper electrodes 17 and 27 may include at least one metal of Al, Cu, W, Ti, Ag, Au, Pt, Ni, C, Mo, Ta, Ir, Ru, Zn, Sn, and In.

Figure 32:
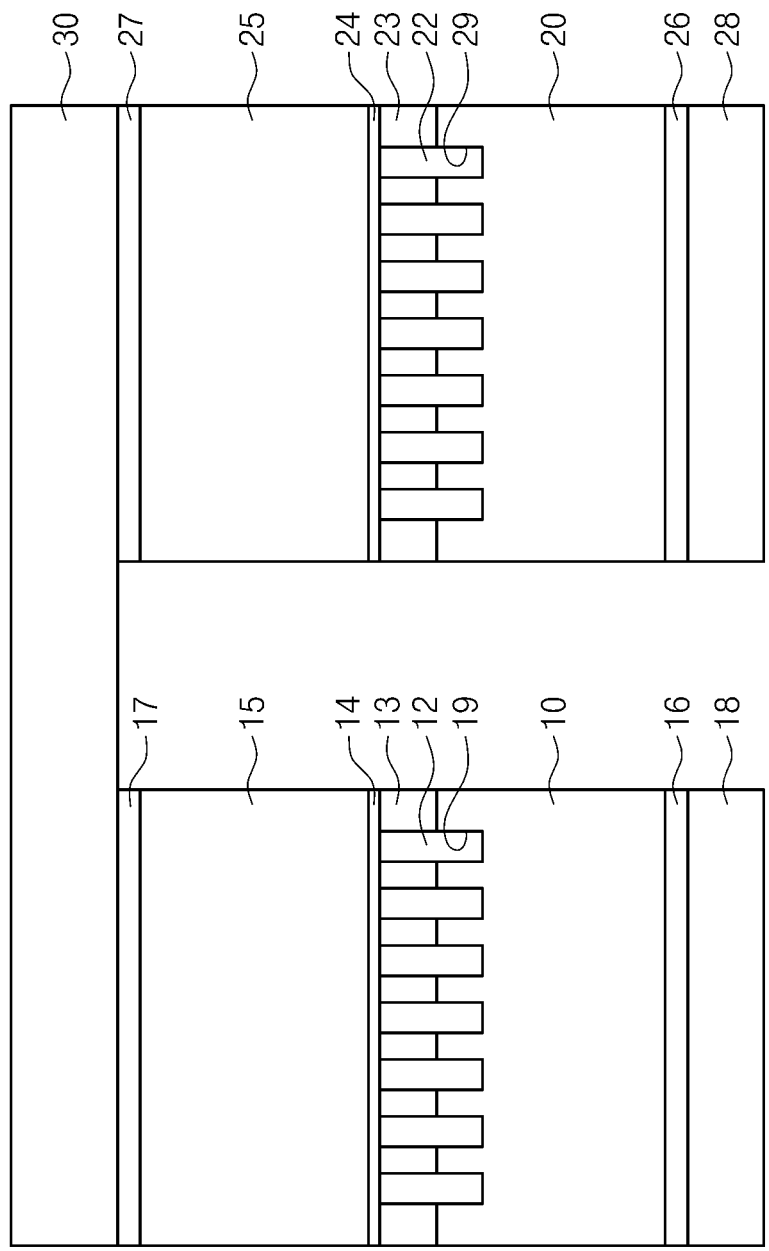

Referring to FIG. 32, first and second cooling pads 18 and 28 are respectively formed under the first and second lower electrodes 16 and 26, and a heater pad 30 is formed on the first and second bulk layers 15 and 25. The first and second cooling pads 18 and 28 may be bonded to the first and second lower electrodes 16 and 26 with a metal having excellent conductivity. The first and second cooling pads 18 and 28 may be cooling parts which are to be disposed at a temperature lower than that of the heater pad 30. The heater pad 30 may be bonded to the first and second upper electrodes 17 and 27 with a metal having excellent conductivity. The heater pad 30 may be a heater part which is to be disposed at a temperature higher than that of the first and second cooling pads 18 and 28.

As described above, a method of manufacturing a thermoelectric device according to embodiments of the inventive concept may include respectively stacking first and second nanowires, first and second barrier layers, and first and second bulk layers on first and second substrates. The first and second barrier layers may increase electric conductivity between the first and second nanowires and the first and second bulk layers, and may decrease thermal conductivity therebetween. The first and second substrates may include first and second trenches in which the first and second nanowires are inserted. The first and second trenches may prevent the collapse of the first and second nanowires.

While preferred embodiments of the inventive concept has been particularly shown and described with reference to the accompanying drawings, it will be understood by those of ordinary skill in the art that various changes in form and details may be made therein without departing from the spirit and scope of the present invention as defined by the following claims.

What is claimed is:

1. A thermoelectric device comprising:
    first and second cooling pads;
    first and second lower electrodes that are respectively disposed on the first and second cooling pads;
    first and second substrates that are respectively disposed on the first and second lower electrodes;
    first and second nanowires that are respectively disposed on the first and second substrates;
    first and second barrier layers that are respectively disposed on the first and second nanowires;
    first and second bulk layers that are respectively disposed on the first and second barrier layers;
    first and second upper electrodes respectively on the first and second bulk layers; and
    a heater pad that is disposed on the first and second upper electrodes and connects the first and second upper electrodes,
    wherein the first and second barrier layers increase electric conductivity between the first and second nanowires and the first and second bulk layers, and decrease thermal conductivity therebetween.

2. The thermoelectric device of claim 1, wherein the first and second substrates respectively comprise first and second trenches in which the first and second nanowires are inserted.

3. The thermoelectric device of claim 1, further comprising first and second polymer layers that are respectively formed between the first and second nanowires.

4. The thermoelectric device of claim 3, wherein the first and second polymer layers respectively comprise polyimide.

5. The thermoelectric device of claim 1, wherein the first and second barrier layers respectively comprise a rare metal or a rare earth metal.

6. The thermoelectric device of claim 1, wherein the first and second substrates respectively comprise crystalline silicon that is doped with a conductive impurity.

* * * * *